United States Patent [19]
Matsumoto

[11] Patent Number: 5,304,392
[45] Date of Patent: Apr. 19, 1994

[54] METHOD OF MANUFACTURING PRINTED WIRING BOARD
[75] Inventor: Masuo Matsumoto, Saitama, Japan
[73] Assignee: Nippon CMK Corp., Japan
[21] Appl. No.: 820,291
[22] Filed: Jan. 6, 1992
[30] Foreign Application Priority Data
    Jul. 24, 1991 [JP] Japan .................................. 3-207612
[51] Int. Cl.⁵ .................... B05D 5/12; B44C 1/22
[52] U.S. Cl. ..................................... 427/96; 427/259; 427/282; 156/661.1
[58] Field of Search .................. 427/96, 259, 282; 156/661.1

[56] References Cited
U.S. PATENT DOCUMENTS
4,732,649  3/1988  Larson et al. ............... 156/661.1
4,994,349  2/1991  Blumenstock et al. ............ 430/314

Primary Examiner—Shrive Beck
Assistant Examiner—David M. Maiorana
Attorney, Agent, or Firm—Bruce L. Adams; Van C. Wilks

[57] ABSTRACT

According to the present invention, inequality in the film thickness of the solder resist and the occurrence of the blur can be eliminated, and it is possible to perform a screen printing for the solder resist with a minute pattern which leads to the formation of a minute solder land.

A solder resist 60 is screen printed while leaving an etching resist 3 in the step for forming a printed wiring circuit 5 on the front of an insulating board 4. Afterward, the etching resist and the overlaid solder resist 60a are simultaneously removed, thereby forming a flat surface over the printed wiring circuit 5.

18 Claims, 3 Drawing Sheets

PRIOR ART

METHOD OF MANUFACTURING PRINTED WIRING BOARD

BACKGROUND OF THE INVENTION

The present invention relates to a method for manufacturing a printed wiring board and, more particularly, is directed to a method for the formation of a solder land.

Conventionally, a solder resist coating is formed for the purpose of preventing the adhesion of solder onto undesired portions of a wiring circuit having a desired pattern. The solder resist film is formed to reduce the volume of solder used, prevent a short circuit from arising due to a soldering bridge, form an appropriate soldering fillet, and protect conductors on the wiring circuit from the external environment.

To form such a solder resist coating, a screen printing method and a photographic developing method is used. The screen printing method is mainly employed for a non-throughhole wiring board, while the photographic developing method tends to be used for a through-hole wiring board (including multi-ply board).

The reason is that the through-hole wiring board has a more miniaturized circuit as compared to the non-throughhole wiring board, thus leading to a miniaturization of the solder resist pattern, which is better accomplished by the photographic developing method due to its adaptation for such circumstances.

Nevertheless, the photographic developing method is poor in productivity and high in production costs owing to increased raw material cost, and hence it s unsuitable for the non-through hole wiring board which requires a mass-productivity and a lower cost.

Also, the solder resist coating in accordance with the screen printing method is executed after etching in a subtractive method (etched wheel method) as shown in FIGS. 8 to 11. That is, an etching resist 3 corresponding to a predetermined pattern is applied on a copper foil 2 of a copper laminated board 1 which has been subjected to a cutting process shown in FIG. 8 FIG. 9, and then a wiring circuit 5 having a predetermined pattern is formed on the front of the insulating board 4 by means of predetermined etching process (FIG. 10).

Afterward, a solder resist 6 is printed on the wiring circuit 5 in FIG. 10 through a predetermined solder mask as shown in FIG. 11 .

The conventional method of forming solder resist 6 has, however, a limitation in accurately forming it after forming the miniaturized circuit. Therefore, as shown in FIGS. 12 and 13, particularly for the formation of a solder land 7 among the solder resist 6 in the process of FIG. 11 the printing may be made in compliance with the required specification of a solder mask diameter in the first printing step, and then a solder land 8 may be printed in a slightly larger diameter (for example, +0.1 m/m to 0.2 m/m in diameter) than the solder mask diameter in the second printing step, followed by the finish over the entire surface. Or alternatively, the solder resist printing is performed in the first printing step as shown in FIG. 14, and then the solder land portion of the solder resist 6 is trimmed 9 by character ink in the second printing step as shown in FIG. 15 (Note that steps shown in FIGS. 14 and 15 may be performed in reverse order).

The following are three main requirements of the printing technique at the time of the solder resist formation in the conventional method of manufacturing the printed wiring board described above.

(1) The copper foil portion of the wiring circuit to be covered with the solder resist must not be exposed.

(2) The area of the solder land must be secured in compliance with the design dimensions so as to suppress blurring of the solder resist.

(3) Minimum coating thickness of the solder resist must be maintained.

In order to satisfy the above requirements of the screen printing method, the requirements (1) and (2) are, however, contrary to each other, which leads to a limitation on miniaturization of the solder land by the screen printing method.

That is, in order to execute the requirement (1), it must be recognized that the printing surface of the solder resist 6 remains uneven due to the existence of the wiring circuit 5 after etching during the manufacture of the printed wiring board as shown in FIG. 16. Upon printing of the solder resist 6, the solder resist ink must be deposited into the recess 12 by applying a printing pressure on a squeegee 11 when printing the solder resist 6 on the front of the wiring circuit 5 through the screen 10 as shown in FIG. 17.

Thus, in principle, the higher the printing pressure and the lower the ink viscosity, the better the solder resist ink flows into the recess 12.

Next, in order to suppress blurring which is the second requirement, the printing pressure of the squeegee 11 must be kept as low as possible.

That is, as shown in FIG. 18, a higher printing pressure causes the top 11a of the squeegee 11 to bend, which results in a larger area of the top 11a in contact with the printed surface 13 of a matter to be printed 14 (Refer to FIG. 19), thereby bringing about a poor separation from the plate, to consequently lead to the occurrence of the blur.

Although apparent from the principle of the screen printing, the screen 10 which has completed the printing for some area must be promptly separated from the printed surface 13. However, if the top 11a of the squeegee 11 has a larger contact area, it takes the screen 10 more time to separate from the printed surface 13, which leads to a poor separation from the plate. In order to prevent this phenomenon and obtain screen printing without blurring, the printed surface must be impressed sequently from the front thereof to the rear through the medium and then separated from the sheet from the front to the rear through the medium without impressing the stamp surface onto the sheet at one time. Also, this is the same where blurring occurs when the entire surface is impressed on the sheet at one time and a transverse minute vibration (a minute vibration following progression of the squeegee) is applied due to an unsteady manual process.

Therefore, as the printing pressure of the squeegee 11 becomes lower, better printing accuracy and without blur using a higher circuit density can be achieved. FIGS. 20 and 21 show a state of the printed surface 13 when squeegee 11 is under a lower printing pressure.

The following conclusion is derived from the above discussion. The conditions of the screen printing technique for the requirements of the perfect covering of the first copper foil portion which is required in forming of the solder resist by means of the screen printing method are that preferably the printing pressure of the squeegee 11 is high and the viscosity of the solder resist ink is low. While on the contrary, the conditions of the screen printing technique for the requirement that the blur of the second solder resist must be suppressed are that preferably the printing pressure is low and the viscosity of the solder resist ink is high. Under these inconsistent conditions conventionally, the screen printing method must be carried out having only one or two minutes between the movements of the squeegee 11.

Thus, even the adoption of the methods as shown in FIGS. 12, and 13, and FIGS. 14 and 15 in forming of the solder resist does not basically change the state of unevenness of the printed surface. Due to the contradictory relationship described above, there is a technical limitation for mass production that the diameter of the solder land 7 formed by the application of solder resist 6 is limited to about 1.4 mm.

Furthermore, with regard to controlling the thickness of the resist coating which is referred to as the third technical requirement on forming the solder resist by the screen printing method, the thickness of the coating of the solder resist 6 conventionally provided on the front of the wiring circuit 5 is shown as portion A in FIG. 22. The portion B is about half of the portion A in the coating thickness, and the difference in coating thickness obtained of portions A and B is conventionally inevitable resulting in problems, such as resistance to moisture, at the portion B during the environmental test or the like. It is therefore very advantageous to entirely equalize the coating thickness, which is not possible using the conventional methods.

Thus, the present invention was conceived in view of the problems in forming the solder resist by means of such conventional screen printing method. An object of the present invention is to provide a method of forming the solder resist by means of the screen printing method, which is capable of forming a minute solder land in a high-density wiring circuit.

SUMMARY OF THE INVENTION

The present invention is intended to provide a method of manufacturing a printed wiring board including a circuit formation step for forming a wiring circuit in a predetermined pattern from copper foil provided on an insulating board, and a land formation step for forming a predetermined solder land after the formation of said wiring circuit.

In accordance with the present invention a solder resist is printed on the front of the wiring circuit while leaving an etching resist used at the time of on wiring circuit formation.

The, solder resist is removed while removing the etching resist on the front of the wiring circuit after the solder resist printing step.

In accordance with the present invention, a solder land is formed in a method of manufacturing a printed wiring board in which a wiring circuit having a predetermined pattern is formed by copper foil provided on an insulating board before the predetermined solder land is formed on the wiring circuit. The present invention enables obtaining the state where the printed surface of the solder resist is planed, and the printing is obtaining using a minimum printing pressure and a maximum ink velocity, thereby achieving formation of the solder resist having a high-density and minute pattern. Also equalization of the coating thickness is obtained according to the present invention.

BRIEF DESCRIPTION OF THE DRAWINGS

For a better understanding of the present invention, reference will now be made by way of example to the accompanying drawings, in which.

DESCRIPTION OF THE PREFERRED EMBODIMENTS

An embodiment of a method of forming a solder resist in accordance with the present invention will now be described with reference to the accompanying drawings.

Figure 1:
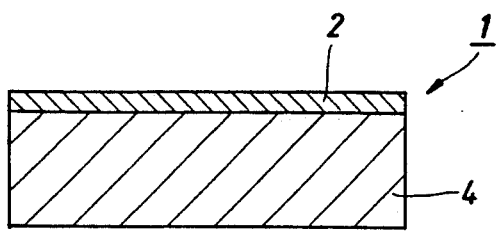
FIG. 1 is an explanatory drawing of the method in accordance with the present invention.
Figure 2:
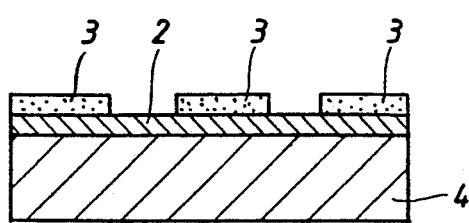
FIG. 2 is an explanatory drawing of the method in accordance with the present invention.
Figure 3:
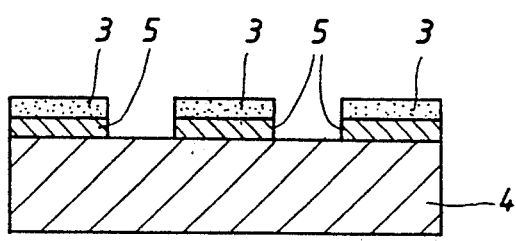
FIG. 3 is an explanatory drawing of the method in accordance with the present invention.
Figure 5:
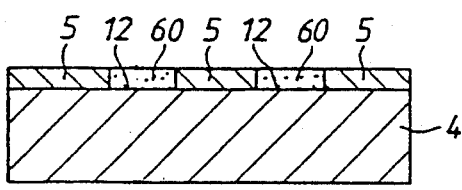
FIG. 5 is an explanatory drawing of the method in accordance with the present invention.
Figure 4:
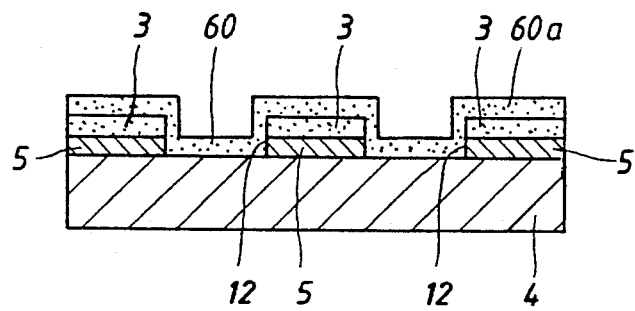
FIG. 4 is an explanatory drawing of the method in accordance with the present invention.
Figure 6:
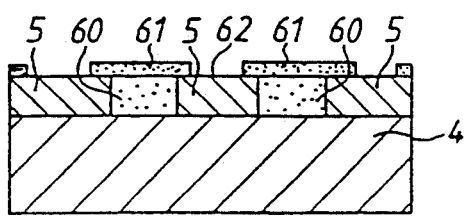
FIG. 6 is an explanatory drawing of the method in accordance with the present invention.
Figure 7:
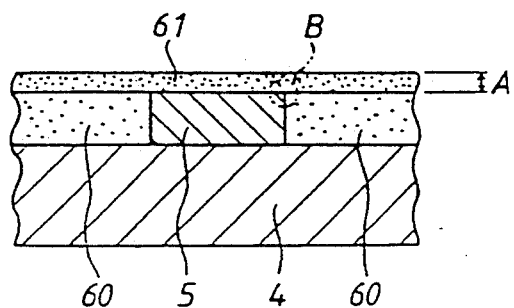
FIG. 7 is an explanatory drawing of the method in accordance with the present invention.

FIGS. 1 to 7 show an embodiment of a method of forming a printed wiring board according to the present invention, in which FIGS. 1 to 3 are explanatory drawings for the method of forming the wiring circuit, FIGS. 4 and 5 are partially sectional views showing a preliminary printing step for the solder resist, FIG. 6 is a partially sectional view showing a solder resist printing step, and FIG. 7 is a sectional view showing a solder resist area except the solder land.

Figure 8:
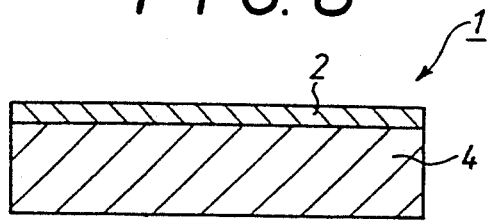
FIG. 8 is an explanatory drawing of the conventional method.
Figure 9:
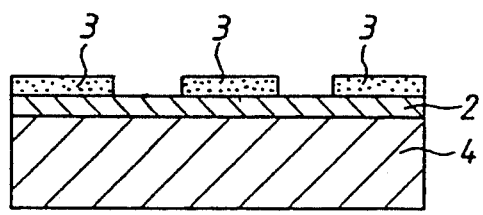
FIG. 9 is an explanatory drawing of the conventional method.
Figure 10:
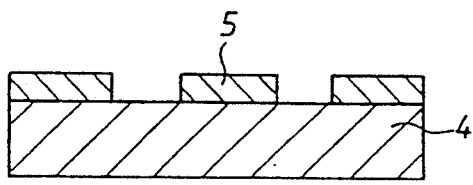
FIG. 10 is an explanatory drawing of the conventional method.
Figure 11:
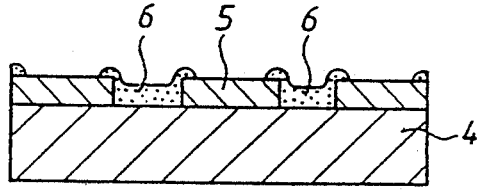
FIG. 11 is an explanatory drawing of the conventional method.
Figure 12:
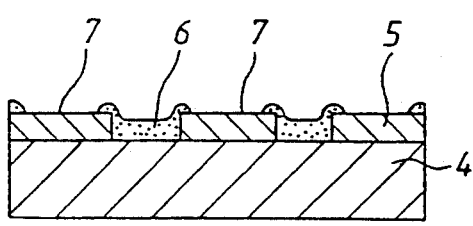
FIG. 12 is an explanatory drawing of the conventional method.
Figure 13:
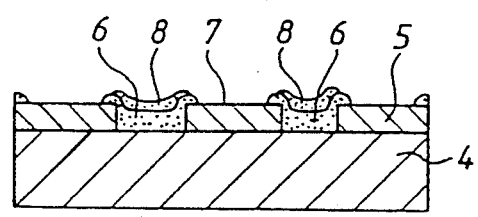
FIG. 13 is an explanatory drawing of the conventional method.
Figure 14:
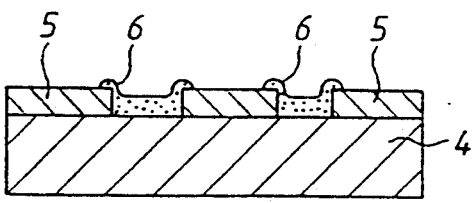
FIG. 14 is an explanatory drawing of the conventional method.
Figure 15:
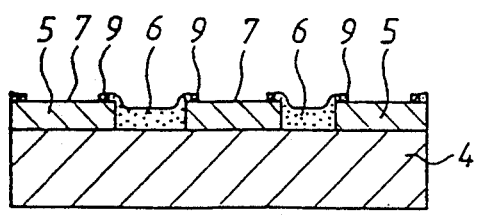
FIG. 15 is an explanatory drawing of the conventional method.
Figure 16:
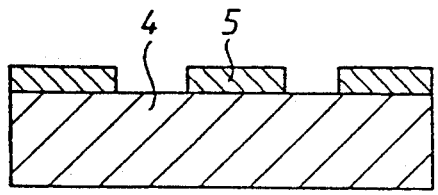
FIG. 16 is an explanatory drawing of the conventional method.
Figure 17:
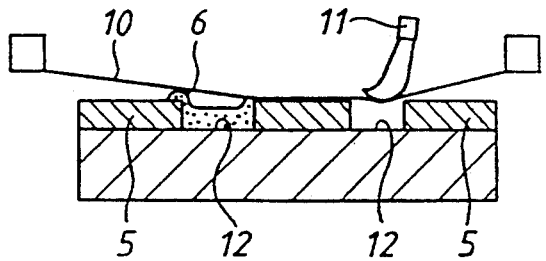
FIG. 17 is an explanatory drawing of the conventional method.
Figure 18:
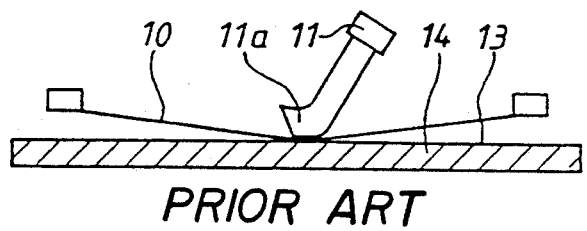
FIG. 18 is an explanatory drawing of the conventional method.
Figure 19:
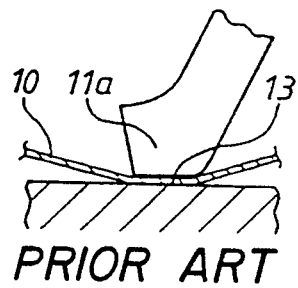
FIG. 19 is an explanatory drawing of the conventional method.
Figure 20:
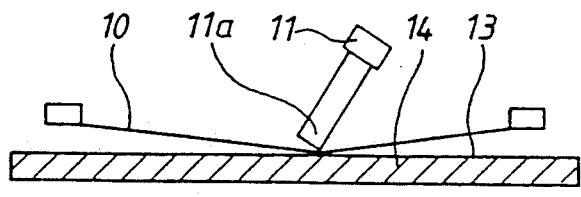
FIG. 20 is an explanatory drawing of the conventional method.
Figure 21:
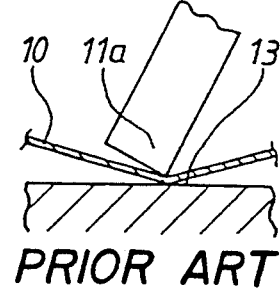
FIG. 21 is an explanatory drawing of the conventional method.
Figure 22:
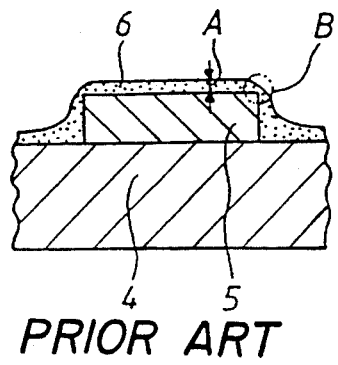
FIG. 22 is an explanatory drawing of the conventional method.

First, a copper laminated board 1 is subjected to a predetermined cutting process as shown in FIGS. 1 and 2, and then to a etching treatment based on a desired pattern, to form a wiring circuit 5 with the desired pattern onto the front surface of an insulating board 4. These sequential processes are executed in accordance with the conventional method descried above as shown in FIGS. 8 to 10 (Refer to FIGS. 1 to 3).

Afterward, with a method of forming a predetermined solder resist onto the front of the wiring circuit 5 after the formation of the printed wiring circuit, a solder resist 60 is preliminarily printed on the insulating board 4 after forming the wiring circuit 5 by means of the screen for the solder resist while leaving the etching resist 3 on the printed wiring circuit 5.

For the execution of such preliminary printing, t is required to select the screen mesh and the ink viscosity in such a manner that the solder resist ink 60 is deposited into a recess 12 to obtain a coating thickness substantially equal to that of the copper foil of the wiring circuit 5 so as to plane the unevenness caused by the existence of the wiring circuit 5 on the front surface of the insulating board 4 as shown in FIG. 4.

After the printing step for the solder resist 60 as shown in FIG. 4, the etching resist 3 is removed while leaving portions of the etching resist 3 deposited on the wiring circuit 5.

Such removal of the etching resist 3 may be performed by an ordinary removal method, for example, using an alkaline solution (3% NaOH).

Furthermore, to facilitate the removal of the etching resist 3, pin holes (not shown) may be previously provided on the area of the solder resist 60a which is applied over the wiring circuit 5.

Thus, the solder resist 60a formed over the etching resist 3 can be simultaneously removed by virtue of the removal of the etching resist 3, resulting in a planar wiring circuit surface on the insulating board 4 as shown in FIG. 5.

Afterward, to a plane obtained by filling solder resist ink 60 into the recess 12 between the wiring circuit 5 on the insulating board 4, there is applied by screen printing the solder resist 61 through a solder mask screen (not shown) having a desired pattern, thereby forming a solder land 62.

Thus, with respect to the screen printing formation of the solder resist 61, for the conventional disadvantageous uneven surface arising from the existence of the wiring circuit 5 and the recess 12 is overcome. It is therefore possible to perform the screen printing for the solder resist 61 by merely selecting the conditions suitable for the design conditions of the solder land 62.

That is, the solder land 62 can be formed using a lower printing pressure and using a solder resist ink having a higher viscosity.

In other words, the printing of the solder resist 61 can be performed under the same conditions as those of the screen printing for the etching resist 3 at the time of the etching treatment as shown in FIG. 9. Also, the copper foil is flat and entirely coated when the screen printing for the etching resist 3 shown in FIG. 9 is performed. At that time, the printing pressure in the pattern printing is 0.8 Kg/cm$^2$ to 1.2 Kg/cm$^2$ in air pressure (some manufacturers of printing machines express the printing pressure in units depending on the top of the squeegee projecting from the screen surface).

It is also possible to mass produce the conductor intervals of 0.01 mm in pattern printing for the etching resist 3, which leads to similarly miniaturized pattern printing for the solder resist 6. It has been proved that a solder land of 0.5 mm in diameter can be sufficiently formed which is much superior to the prior art of 1.4 mm in diameter.

The printing pressure in the conventional screen printing for the solder resist is 2.5 k/cm$^2$ to 3.0 Kg/cm$^2$ at present, under which value there arises problems such as exposure of the copper foil.

As is apparent from FIG. 5, the film thickness of the solder resist 61 provided on the wiring circuit 5 is equalized in both the portions A and B by filling the solder resist ink 60 into the recess 12 during the preliminary printing step, thereby eliminating the occurrence of the difference in the film thickness in portions A and B.

As clear from the above description, according to the present invention, inequality in the film thickness of the solder resist and the occurrence of the blur can be eliminated and it is possible to perform a screen printing for the solder resist with a minute pattern which leads to the formation of a minute solder land.

As a result, there can be executed a mass production of the printed wiring board capable of high-density mounting and further connection to a multi-contact SLI.

What is claimed is:

1. A method of manufacturing a printed wiring board, comprising the sequentially performed steps of: forming a wiring circuit in a pattern by etching a layer of copper foil disposed on an insulating board; printing a solder resist layer over said wiring circuit while leaving a portion of the etching resist used at the time of etching said copper foil on said wiring circuit; removing said solder resist while removing said etching resist disposed on said wiring circuit after said solder resist printing step so as to form an even surface having solder resist remaining between wiring lines of the wiring circuit, the even surface being effective to facilitate the formation of a second layer of solder resist by silk screening; and forming a second layer of solder resist by silk-screening over the even surface leaving a portion of the wiring circuit exposed to form a solder land.

2. A method of manufacturing a printed circuit board, comprising the sequentially performed steps of: providing a substrate; forming a layer of conductive material on at least one surface of the substrate; forming a layer of etching resist having a pattern; selectively etching the conductive material to form therefrom a circuit pattern having wiring lines disposed on the substrate and having at least one recess between two of the wiring lines while leaving the etching resist layer disposed over at least a portion of the circuit pattern and leaving the surface of the substrate in the recess exposed; forming a solder resist layer having a portion over at least a portion of the etching resist layer and a portion over the surface of the substrate in the recess; and removing the etching resist layer disposed on the circuit pattern while simultaneously removing the portion of the solder resist layer formed over the etching resist layer while leaving the portion of the solder resist layer formed over the surface of the substrate in the recess so as to form an even surface comprised of the two wiring lines and the portion of the solder resist layer formed over the surface of the substrate in the recess, the even surface being effective to facilitate the formation of a second layer of solder resist by silk screening.

3. A method of manufacturing a printed circuit board according to claim 2; including forming pin holes in the portion of solder resist layer formed over the etching resist layer to facilitate removal of the etching resist layer.

4. A method of manufacturing a printed circuit board according to claim 2; wherein the solder resist layer is formed by silk screening.

5. A method of manufacturing a printed circuit board according to claim 2; including a forming a second layer of solder resist over the portion of the solder resist layer formed over the surface of the substrate in the recess to form at least one solder land comprised of a portion of one of the wiring lines.

6. A method of manufacturing a printed circuit board according to claim 5; wherein the second layer of solder resist is formed by silk screening.

7. A method of manufacturing a printed circuit board according to claim 6; wherein the silk screening is performed at a printing pressure between 0.8 Kg/cm$^2$ and 1.2 Kg/cm$^2$.

8. A method of manufacturing a printed circuit board according to claim 6; wherein the silk screening is performed at a printing pressure less than 1.2 Kg/cm$^2$.

9. A method of manufacturing a printed circuit board according to claim 8; wherein the solder land has a diameter of 0.5 mm.

10. A method of manufacturing a printed circuit board according to claim 8; wherein the solder land has a diameter of less than 1.4 mm.

11. A method of manufacturing a printed circuit board according to claim 10; wherein the step of removing the portion of the solder resist layer and the step of removing the etching resist layer disposed on the circuit pattern are performed simultaneously.

12. A method of manufacturing a printed circuit board according to claim 2; wherein the step of removing the portion of the solder resist layer and the step of removing the etching resist layer disposed on the circuit pattern are performed simultaneously.

13. A method of manufacturing a printed circuit board according to claim 2; including forming a second layer of solder resist over the entire even surface.

14. A method of manufacturing a printed circuit board according to claim 13; including forming pin holes in the portion of solder resist layer formed over the etching resist layer to facilitate removal of the etching resist layer.

15. A method of manufacturing a printed circuit board according to claim 13; wherein the solder resist layer is formed by silk screening.

16. A method of manufacturing a printed circuit board according to claim 13; wherein the second layer of solder resist is formed by silk screening.

17. A method of manufacturing a printed circuit board according to claim 16; wherein the silk screening is performed at a printing pressure less than 1.2 Kg/cm$^2$.

18. A method of manufacturing a printed circuit board according to claim 13; wherein the step of removing the portion of the solder resist layer and the step of removing the etching resist layer disposed on the circuit pattern are performed simultaneously.

* * * * *